(12) United States Patent
Zang et al.

(10) Patent No.: US 11,417,701 B2
(45) Date of Patent: Aug. 16, 2022

(54) IMAGE SENSOR WITH VERTICAL TRANSFER GATE AND SQUARE RESET AND SOURCE FOLLOWER LAYOUT

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 143 days.

(21) Appl. No.: 16/995,609

(22) Filed: Aug. 17, 2020

(65) Prior Publication Data

US 2022/0052103 A1 Feb. 17, 2022

(51) Int. Cl.
*H01L 27/146* (2006.01)
*H04N 5/353* (2011.01)
*H04N 5/374* (2011.01)
*H04N 5/378* (2011.01)

(52) U.S. Cl.
CPC .. *H01L 27/14641* (2013.01); *H01L 27/14603* (2013.01); *H01L 27/14614* (2013.01); *H01L 27/14643* (2013.01); *H04N 5/353* (2013.01); *H04N 5/378* (2013.01); *H04N 5/3741* (2013.01)

(58) Field of Classification Search
CPC ......... H01L 27/14641; H01L 27/14603; H01L 27/14614; H01L 27/14643; H04N 5/353; H04N 5/3741; H04N 5/378
See application file for complete search history.

(56) References Cited

U.S. PATENT DOCUMENTS

| 7,525,077 | B2 * | 4/2009 | Kim | H01L 27/14603 257/292 |
| 8,101,978 | B2 | 1/2012 | Dai et al. | |
| 8,471,312 | B2 * | 6/2013 | Kudoh | H01L 27/14603 257/292 |

* cited by examiner

*Primary Examiner* — Ahmed A Berhan
(74) *Attorney, Agent, or Firm* — Lathrop GPM LLP

(57) ABSTRACT

A CMOS image sensor has an array of photodiode cells, the photodiode cells each include four buried photodiodes coupled by vertical transfer gate transistors to a single floating node diffusion. Each cell also has a reset transistor coupled to the floating node diffusion, a source follower transistor having gate coupled to the floating node diffusion, and a read select transistor coupled to the source follower transistor. The reset transistor, source follower transistor, and read select transistor have predominately gate and shape edges oriented at an angle greater than 30-degrees and less than 60-degrees from a line extending along an entire horizontal row of photodiodes of a photodiode array of the image sensor and are formed vertically above, and in the same integrated circuit as, the photodiodes of the photodiode array.

15 Claims, 5 Drawing Sheets

IMAGE SENSOR WITH VERTICAL TRANSFER GATE AND SQUARE RESET AND SOURCE FOLLOWER LAYOUT

FIELD

The present application relates to the field of layout of transistors and photodiodes within a photodiode array of an image sensor.

SUMMARY

In an embodiment, a CMOS image sensor has an array of photodiode cells, where a plurality of the photodiode cells each include a first, second, third, and fourth buried photodiode, each photodiode coupled by a vertical transfer gate transistor to a single floating node diffusion, a reset transistor coupled to the floating node diffusion, a source follower transistor having gate coupled to the floating node diffusion, and a read select transistor having drain coupled to a source of the source follower transistor. The reset transistor, source follower transistor, and read select transistor have predominately gate and shape edges oriented at an angle greater than 30-degrees and less than 60-degrees from a line extending along an entire horizontal row of photodiodes of a photodiode array of the image sensor and are formed vertically above, and in the same integrated circuit as, the photodiodes of the photodiode array.

In another embodiment, a method of generating an electronic image includes resetting a buried photodiode of a row of photodiodes of a photodiode array of an image sensor by turning on a reset transistor and at least one vertical transfer gate transistor, wherein the reset transistor is configured primarily on top of the buried photodiode and has predominant edges oriented at an angle between 30 and 60 degrees from a line drawn through photodiodes of a row of photodiodes of the photodiode array; turning off the reset transistor and vertical transfer gate transistor, then waiting for an exposure time; and turning on the vertical transfer gate transistor to couple the buried photodiode to a source follower, the source follower having a gate shaped in "U" or "O" shape surrounding the read select transistor. In another embodiment, the source follower has a linear gate oriented at the angle between 30 and 60 degrees from a line drawn through photodiodes of a row of the photodiode array.

DETAILED DESCRIPTION

Typically, CMOS image sensors incorporate an array of photodiodes. For high sensitivity, it is desirable that the photodiodes occupy as great a percentage of the array as possible. Further, to achieve high pixel counts, it is desirable that each photodiode and its associated circuitry occupy as little die area as possible.

Figure 1:
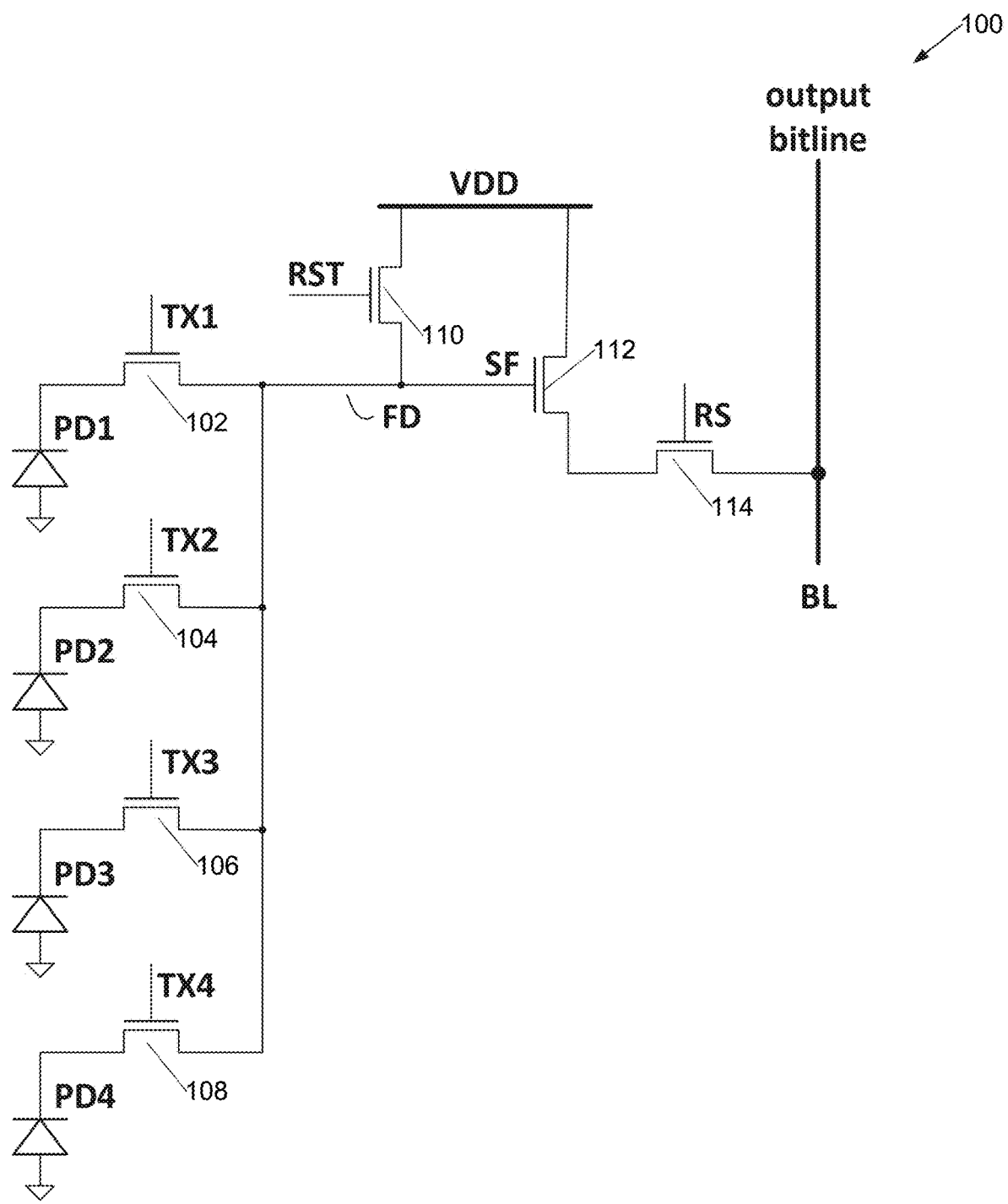
FIG. 1 is a schematic diagram illustrating a cell containing four photodiodes with associated circuitry.

To minimize die area associated with each photodiode while maximizing photodiode area, we build the circuitry associated with each photodiode atop the photodiode FIG. 1 schematically illustrates a cell 100 containing four photodiodes PD1, PD2, PD3, PD4 with associated circuitry including transfer-gate transistors 102, 104, 106, 108 controlled by photodiode selection lines TX1, TX2, TX3, TX4, floating node FD, a reset transistor 110 controlled by a reset line RST, a source follower transistor 112, and a read select transistor 114 configured to selectively couple the source follower transistor to an output bit line BL when the cell is being read. In our CMOS image sensors, the photodiodes PD1, PD2, PD3, and PD4 are buried photodiodes that couple through vertical transfer-gate transistors 102, 104, 106, 108 to a common floating node FD.

In a layout 200 of the 4-photodiode cell there are four photodiodes 202, 204, 206, 208. Each photodiode is accessed through one or more separate vertical transfer-gate transistors formed in drawn trenches 210, 212, 214, 216. Although one vertical transfer-gate transistor is illustrated for each photodiode in FIG. 2, there may be two or more vertical transfer-gate transistors coupled in parallel for each photodiode in alternative embodiments. Atop the photodiodes 202, 204, 206, 208 is drawn a diffusion region 220. Surrounding the drawn trenches is a rectangular ring-shaped polysilicon line 222 that is coupled to the reset line RST and forms a reset transistor 110 (FIG. 1) where it intersects the drawn diffused region 220 and which separates the drawn diffusion region into a floating node region 224 and a drain region 226 coupled to a power supply VDD. Floating node region 224 is coupled to a second rectangular ring-shaped polysilicon line 230 that serves as a gate of a source follower transistor 112 and which separates the diffusion region 220 into drain region 226 and a source region 232 of the source follower 112. One or more additional read-selection lines 234, 236, further separate the drawn diffusion region 220 into source region 232 of the source follower and a diffusion 238 coupled to an output bitline BL. The diffusion region 220, source follower transistor gate, and reset transistor gate are configured primarily on top of, and in the same silicon substrate as, the photodiodes as illustrated in FIGS. 2 and 3.

Figure 2:
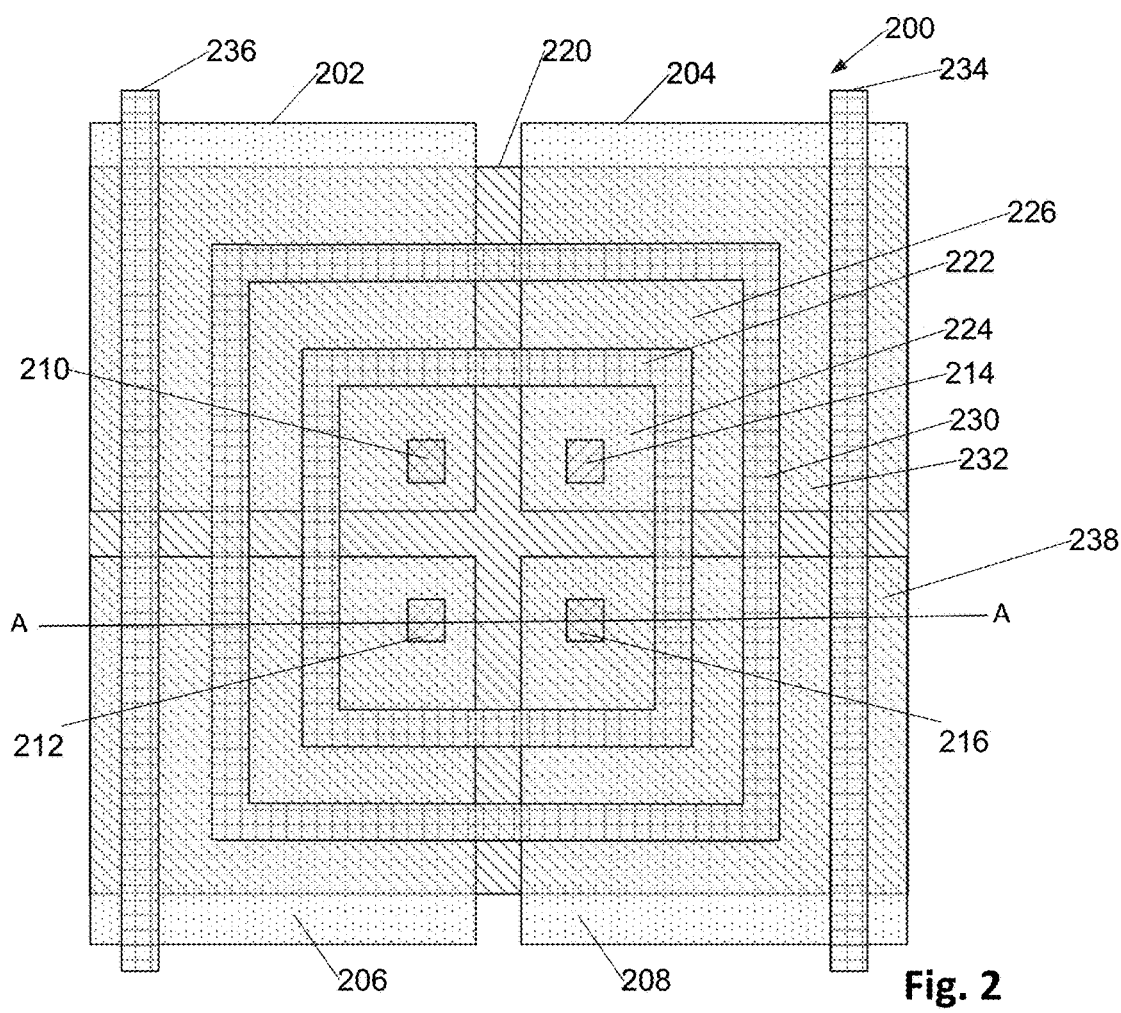
FIG. 2 illustrates a partial layout of a cell having a schematic diagram according to FIG. 1 where the selection transistors are vertical transistors and the reset, source follower, and read select transistor are formed over the photodiodes.
Figure 3:
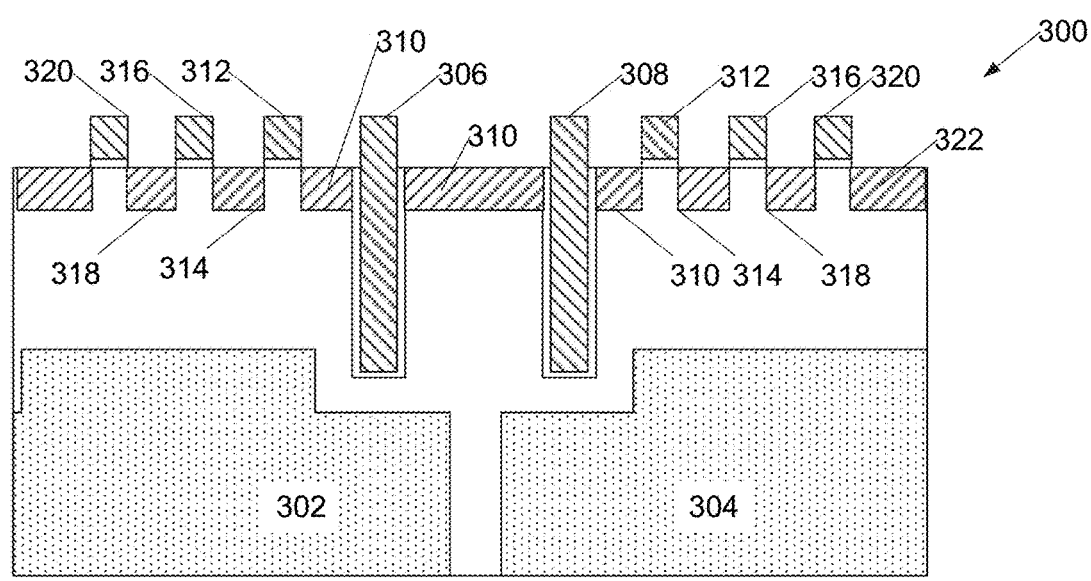
FIG. 3 illustrates a schematic partial cross section of a cell taken along the line A-A of FIG. 2.

In a cross section 300 taken along A-A in FIG. 2, the buried photodiodes 302, 304 are shown coupling through vertical transfer-gate transistors having gates 306, 308 to floating node 310 diffusion that surrounds the vertical transfer-gate transistors. Rectangular line 312 surrounds floating node diffusion 310, is coupled to the reset line RST, serves as a gate of reset transistor 110, and separates floating node diffusion from a VDD power diffusion 314. Rectangular line 316 surrounds VDD power diffusion 314, is coupled to the floating node 310 diffusion, and serves as a gate of a source follower 112 transistor with source at node 318. In order to read the group of four photodiodes represented by the cell, a read select transistor 114 having drain at node 318, gate 320 coupled to a read select line and source at a bit line 322 is also provided.

Additional layers and shapes are provided in the image sensor integrated circuit beyond those layers illustrated, such as metal reset lines RST that couple to ring-shaped gate 222, metal power lines coupled to the VDD power diffusion 314, a metal bit line coupled to bit line diffusion 322, metal lines coupled to the read selection line 320. Further, the image sensor integrated circuit may have additional circuitry on it such as address decoders and counters, analog-to-digital converters, video processors, and memory devices.

In embodiments, the buried photodiodes are formed of N-doped silicon embedded in P-doped silicon, and the VDD power diffusion, the floating node diffusion, and node 318 are N-doped silicon. In these embodiments, the vertical transfer-gate transistor, read select transistor, source follower transistor, and reset transistor are N-channel transistors as known in the art of CMOS integrated circuits.

In an alternative embodiment, instead of four buried photodiodes lying beneath the ring-shaped reset and source-follower transistors, there are two, six, or eight photodiodes each having a vertical transfer gate to a common floating node with a ring-shaped reset transistor and a ring-shaped source-follower transistor surrounding the floating node and formed primarily on top of the two, six, or eight photodiodes.

The four-buried-photodiode cell with transistors configured to overlie, or be formed on top of, the photodiodes illustrated in FIGS. 1-3 are operated to form an image by resetting the photodiodes by turning on the vertical transfer gate transistors and the reset transistor; the vertical transfer gate transistors and reset transistor are turned off for an exposure time until it is desired to read charge on the photodiodes, the charge on the photodiodes having been altered by photocurrent in the photodiodes during the exposure time. To read charge on the photodiodes, the vertical transfer gate transistor for a selected photodiode is turned on to couple charge to the floating node and thence to the gate of the source follower, while the read select transistor is turned on.

Figure 4:
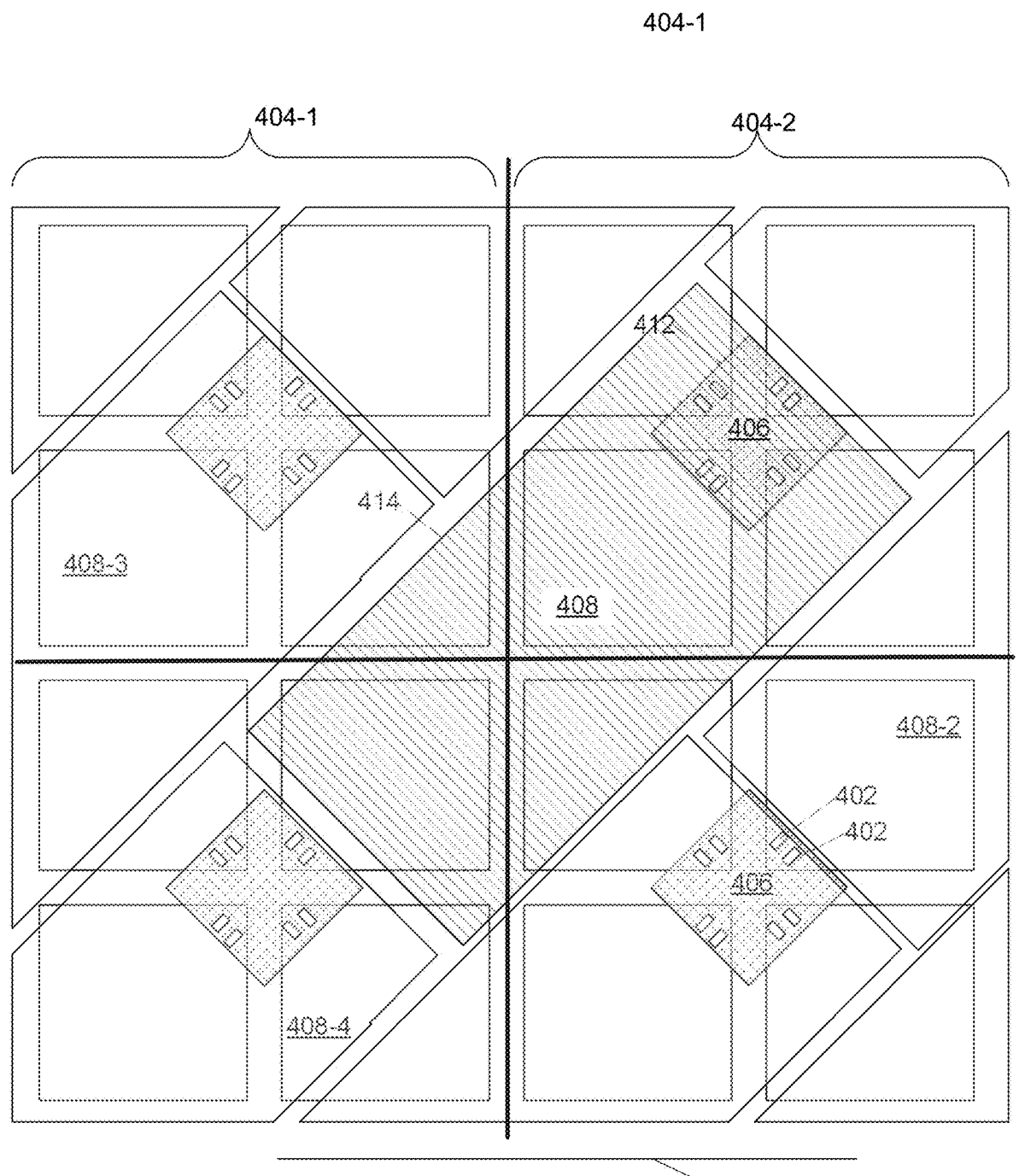
FIG. 4 illustrates a photodiode layout with four-pixel cells each having four buried photodiodes with paired vertical selection transistors sharing a diamond-shaped floating node.

We have modified the photodiode layout to use two vertical selection transistors 402 (FIG. 4) in parallel for each buried photodiode of each four-photodiode pixel cell 404-1, 404-2 in an array of photodiodes. Each four-photodiode pixel cell has a common floating node diffusion 406 overlying corners of all four of the photodiodes of the cell. We shape the floating node diffusion as a diamond, or a square having edges 412 rotated 45-degrees from the X-axis 410 or rows of photodiodes of the photodiode array. This leaves it possible to tile an array of approximately rectangular regions 408 atop the photodiodes, each region 408, 408-2, 408-3, 408-4 having edges 414 rotated 45-degrees from the X axis 410 of the array, each region 408 associated with, and including, one of the common floating node diffusions 406.

In embodiments, we build the reset transistor 110 (FIG. 3), the source follower transistor 112, and a read select transistor 114 as illustrated in FIG. 3 in these approximately rectangular regions 408 for each cell. Reset transistor 110 is coupled to the floating node diffusion, the source follower transistor 112 has its gate coupled to the floating node diffusion, and the read select transistor has its drain coupled to a source of the source follower transistor 112. In each of the illustrated embodiments, we build the transistors 110, 112, 114 using layout with predominant lines and edges oriented at a 45-degree angle from the X-axis, or a line extending along an entire horizontal row of the photodiodes, of the photodiode array in order to optimize layout of these transistors vertically above, and in the same integrated circuit as, the photodiodes.

Figure 5:
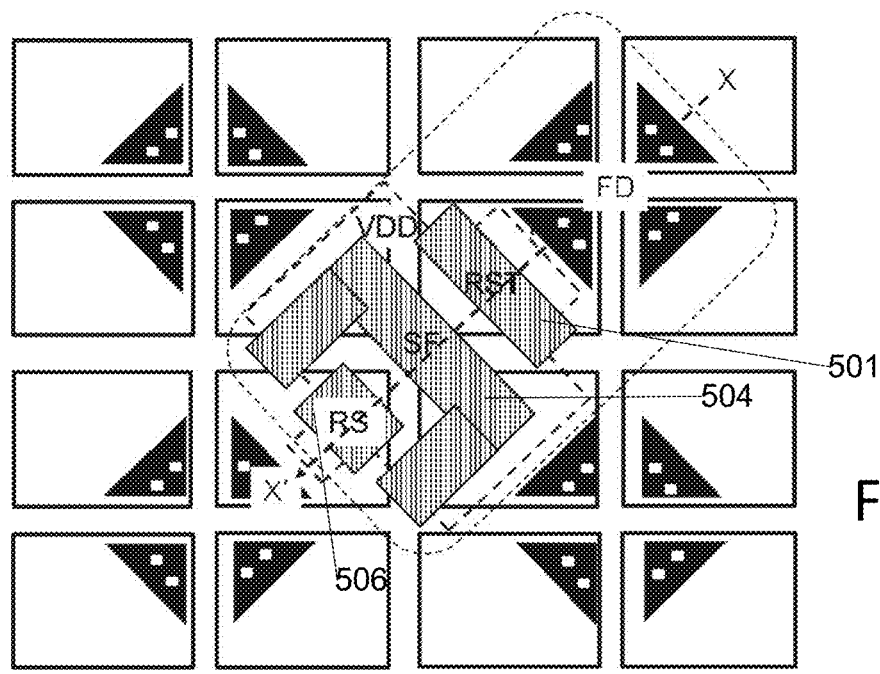
FIG. 5 is a sketch illustrating where each transistor of the cell is located in a first embodiment.

In a first embodiment, FIG. 5, a linear reset transistor 501 a U-shape source follower (SF) transistor 504 intended to optimize speed of reading the photodiode array, and a smaller read-select transistor 506 are provided. In this embodiment, the read select transistor 506 also has a U-shaped gate surrounded by the U-shaped gate of the source follower transistor.

Figure 6:
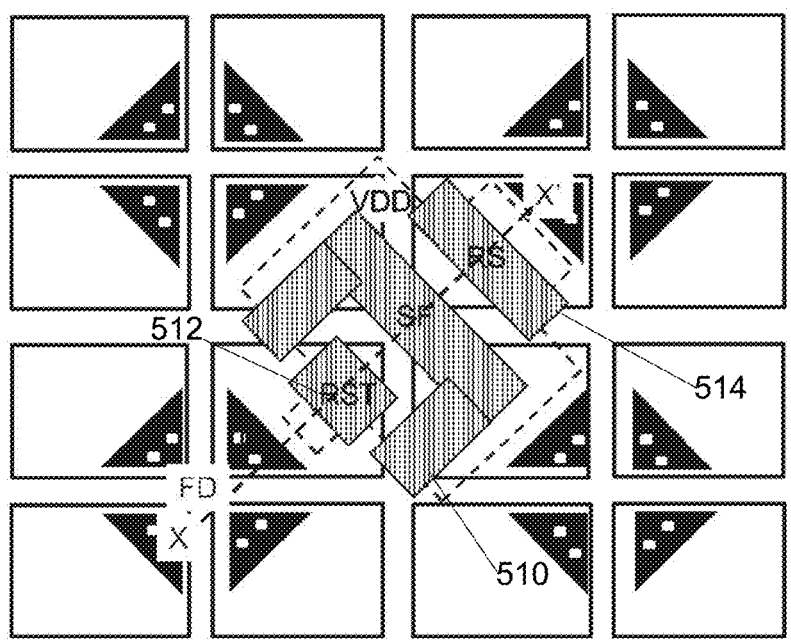
FIG. 6 is a sketch illustrating where each transistor of the cell is located in a second embodiment.

FIG. 6 is a sketch illustrating where each transistor of the cell is located in a second embodiment, an embodiment like a reversal of the embodiment of FIG. 5. In this embodiment, a U-shape source follower (SF) transistor 510 is provided to optimize read speed of the photodiode array, this encloses within arms of its U a smaller U-shape reset transistor 512. The source follower transistor feeds a linear read select transistor 514.

Figure 7:
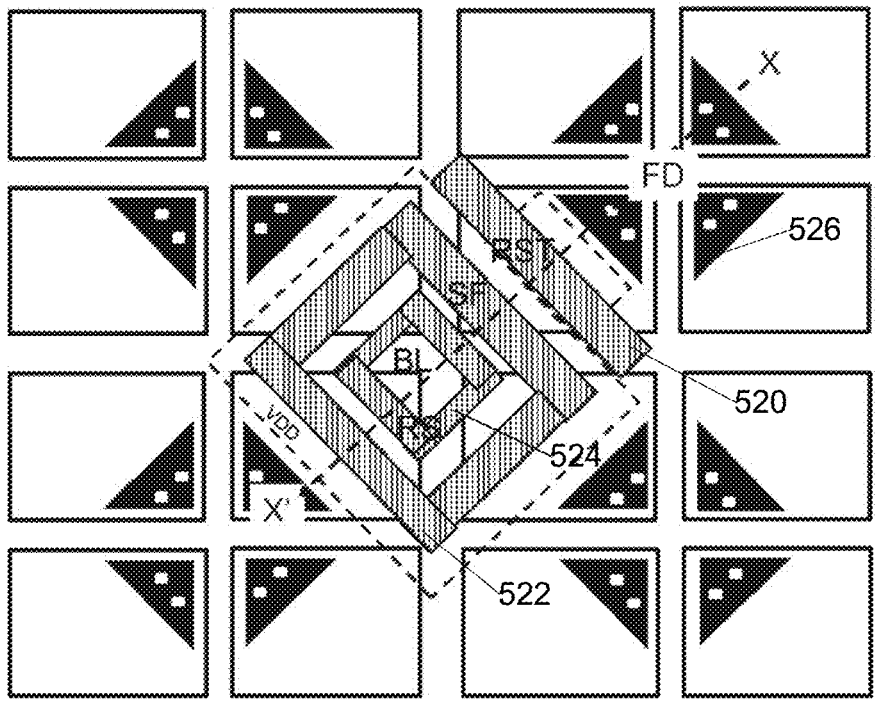
FIG. 7 is a sketch illustrating where each transistor of the cell is located in a third embodiment.

FIG. 7 is a sketch illustrating where each transistor of the cell is located in a third embodiment having a linear reset transistor 520, an O-shaped source follower transistor 522, and an O-shaped read-select transistor 524 inside the O-shape source follower transistor 522. This embodiment may be modified by effectively reversing the transistors by copying the layout of FIG. 2 and rotating it to fit around the floating node diffusion 526

Figure 8:
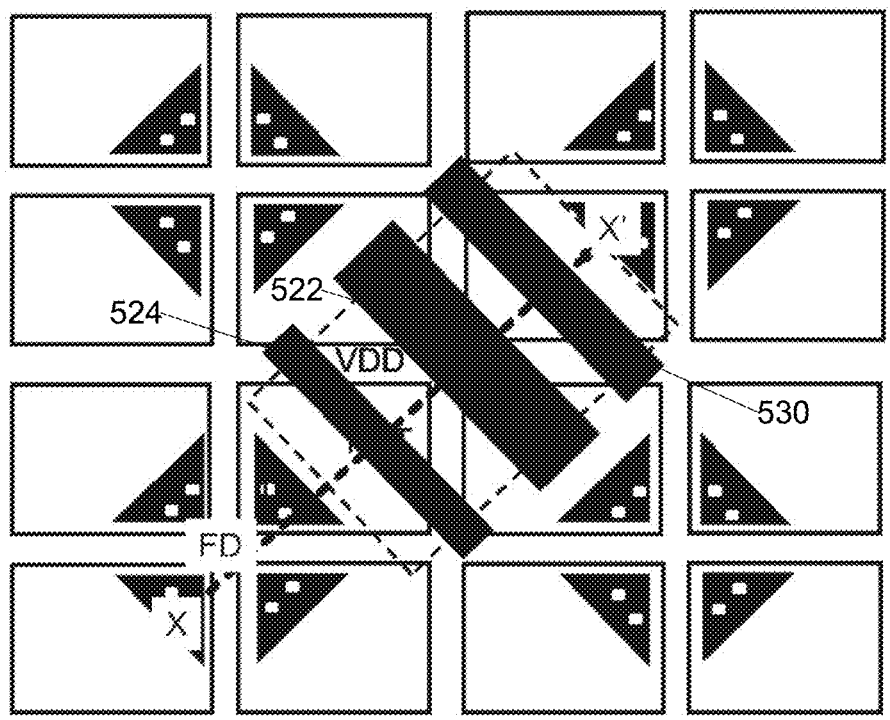
FIG. 8 is a sketch illustrating where each transistor of the cell is located in a fourth embodiment.

FIG. 8 is a sketch illustrating where each transistor of the cell is located in a fourth embodiment, where reset 530, source-follower 522, and read-select 524 transistors are all essentially linear in form. Source-follower 522 is larger than the read-select 524 and reset transistor 530 to optimize read speed and to reduce noise.

The forgoing discussion of 45-degree angles of lines used in the transistors relative to a row of the photodiodes assumes each photodiode is approximately square. In some embodiments the photodiodes may be rectangular such that regions 408 may be oriented at a shallower angle than the 45 degrees ideal with square photodiodes with the angle still being greater than 30 degrees, and less than 60 degrees from a line drawn through a horizontal row of the photodiodes of the photodiode array of the image sensor.

Combinations

The features described herein may be combined in several ways to form combinations. Among combinations anticipated by the inventors are:

A CMOS image sensor designated A comprising an array of photodiode cells, where a plurality of the photodiode cells each include a first, second, third, and fourth buried photodiode, each photodiode coupled by a vertical transfer gate transistor to a single floating node diffusion, a reset transistor coupled to the floating node diffusion, a source follower transistor having gate coupled to the floating node diffusion, and a read select transistor having drain coupled to a source of the source follower transistor. The reset transistor, source follower transistor, and read select transistor have predominately gate and shape edges oriented at an angle greater than 30-degrees and less than 60-degrees from a line extending along an entire horizontal row of photodiodes of a photodiode array of the image sensor and are formed vertically above, and in the same integrated circuit as, the photodiodes of the photodiode array.

A CMOS image sensor designated AA including the image sensor designated A where, in the plurality of photodiode cells, the source follower transistor has "U" shape.

A CMOS image sensor designated AB including the image sensor designated A or AA wherein, in the plurality of photodiode cells, the read select transistor has "U" shape.

A CMOS image sensor designated AC including the image sensor designated A, AA, or AB wherein, in the plurality of photodiode cells, the reset transistor has "U" shape.

A CMOS image sensor designated AD including the image sensor designated A, wherein, in the plurality of photodiode cells, the source follower transistor has "O" shape.

A CMOS image sensor designated AE including the image sensor designated A or AD wherein, in the plurality of photodiode cells, the reset transistor has "O" shape A CMOS image sensor designated AF including the image sensor designated A, AD or AE wherein, in the plurality of photodiode cells, the read transistor has "O" shape A CMOS image sensor designated AG including the image sensor designated A, AA, AB, AC, AD, AE, AF, or AG, wherein, in the plurality of photodiode cells, the source follower transistor is coupled through a read select transistor to a bit line, and wherein the read select transistor overlies at least one of the first, second, third, or fourth photodiodes.

A CMOS image designated AH including the CMOS image sensor designated AG wherein the reset transistor and the source follower transistor are N-channel transistors.

A method designated B of generating an electronic image includes resetting a buried photodiode of a row of photodiodes of a photodiode array of an image sensor by turning on a reset transistor and at least one vertical transfer gate transistor, wherein the reset transistor is configured primarily on top of the buried photodiode and has predominant edges oriented at an angle between 30 and 60 degrees from a line drawn through photodiodes of a row of photodiodes of the photodiode array; turning off the reset transistor and vertical transfer gate transistor, then waiting for an exposure time; and turning on the vertical transfer gate transistor to couple the buried photodiode to a source follower, the source follower having a gate shaped in "U" or "O" shape surrounding the read select transistor.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A CMOS image sensor comprising an array of photodiode cells,
   where a plurality of the photodiode cells each comprise:
   a first, second, third, and fourth buried photodiode, each photodiode coupled by a vertical transfer gate transistor to a single floating node diffusion,
   a reset transistor coupled to the single floating node diffusion,
   a source follower transistor having gate coupled to the single floating node diffusion,
   and a read select transistor having drain coupled to a source of the source follower transistor;
   where the reset transistor, source follower transistor, and read select transistor have predominately gate and shape edges oriented at an angle greater than 30-degrees and less than 60-degrees from a line extending along an entire horizontal row of photodiodes of a photodiode array of the image sensor and are formed vertically above, and in the same integrated circuit as, the photodiodes of the photodiode array.

2. The CMOS image sensor of claim 1 wherein, in the plurality of photodiode cells, the source follower transistor has "U" shape.

3. The CMOS image sensor of claim 2 wherein, in the plurality of photodiode cells, the read select transistor has "U" shape.

4. The CMOS image sensor of claim 3 wherein, in the plurality of photodiode cells, the reset transistor has "U" shape.

5. The CMOS image sensor of claim 4 wherein, in the plurality of photodiode cells, the source follower transistor is coupled through the read select transistor to a bit line, and wherein the read select transistor overlies at least one of the first, second, third, or fourth buried photodiodes.

6. The CMOS image sensor of claim 1 wherein, in the plurality of photodiode cells, the source follower transistor has "O" shape.

7. The CMOS image sensor of claim 6 wherein, in the plurality of photodiode cells, the reset select transistor has "O" shape.

8. The CMOS image sensor of claim 6 wherein, in the plurality of photodiode cells, the read select transistor has "O" shape.

9. The CMOS image sensor of claim 6 wherein, in the plurality of photodiode cells, the source follower transistor is coupled through the read select transistor to a bit line, and wherein the read select transistor overlies at least one of the first, second, third, or fourth photodiodes.

10. The CMOS image sensor of claim 9 wherein the reset transistor and the source follower transistor are N-channel transistors.

11. The CMOS image sensor of claim 1 where the reset transistor, source follower transistor, and read select transistor have predominately gate and shape edges oriented at 45-degrees from a line extending along an entire horizontal row of photodiodes of a photodiode array of the image sensor and are formed vertically above, and in the same integrated circuit as, the photodiodes of the photodiode array.

12. The CMOS image sensor of claim 1 where the source follower has a linear gate oriented at the angle between 30 and 60 degrees from the line drawn through photodiodes of a row of the photodiode array.

13. A method of generating an electronic image comprising:
    resetting a buried photodiode of a row of photodiodes of a photodiode array of an image sensor by turning on a reset transistor and at least one vertical transfer gate transistor, wherein the reset transistor is configured primarily on top of the buried photodiodes and has predominant edges oriented at an angle between 30 and 60 degrees from a line drawn through photodiodes of a row of photodiodes of the photodiode array;
    turning off the reset transistor and vertical transfer gate transistor, then waiting for an exposure time; and
    turning on the at least one vertical transfer gate transistor to couple the buried photodiode to a source follower, the source follower having a gate having a shape selected from a linear gate, a "U" shape surrounding the read-select transistor, and an "O" shape surrounding the read select transistor.

14. The method of claim 13 wherein the source follower has "U" or "O" shape.

15. The method of claim 13 wherein the reset transistor is configured with predominant edges oriented at an angle of 45-degrees from a line drawn through photodiodes of a row of photodiodes of the photodiode array.

\* \* \* \* \*